United States Patent
Noh et al.

(10) Patent No.: US 9,392,699 B2
(45) Date of Patent: Jul. 12, 2016

(54) PRINTED CIRCUIT BOARD AND METHOD OF MANUFACTURING THE SAME

(71) Applicant: Samsung Electro-Mechanics Co., Ltd., Gyeonggi-do (KR)

(72) Inventors: Seung Hyun Noh, Yeongi-gun (KR); Dong Uk Lee, Yeongi-gun (KR); Young Gon Kim, Yeongi-gun (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/030,983

(22) Filed: Sep. 18, 2013

(65) Prior Publication Data

US 2014/0174810 A1    Jun. 26, 2014

(30) Foreign Application Priority Data

Dec. 26, 2012  (KR) .......... 10-2012-0153495

(51) Int. Cl.
*H05K 1/11*    (2006.01)
*H05K 1/03*    (2006.01)
*H05K 1/00*    (2006.01)
*H05K 3/00*    (2006.01)

(52) U.S. Cl.
CPC ............. *H05K 3/0097* (2013.01); *H05K 1/113* (2013.01); *H05K 2201/0376* (2013.01); *H05K 2203/1536* (2013.01)

(58) Field of Classification Search
CPC ............. H05K 3/0097; H05K 1/113; H05K 2201/0376
USPC ........... 174/262–266, 257, 258, 255; 361/767
See application file for complete search history.

(56) References Cited

U.S. PATENT DOCUMENTS

| | | | | |
|---|---|---|---|---|
| 4,985,600 | A * | 1/1991 | Heerman | 174/255 |
| 7,473,629 | B2 * | 1/2009 | Tai | H05K 3/3452 |
| | | | | 257/E21.508 |
| 2006/0246702 | A1 * | 11/2006 | Kim | H05K 3/3452 |
| | | | | 438/611 |
| 2007/0120253 | A1 * | 5/2007 | Oh et al. | 257/737 |
| 2008/0135279 | A1 * | 6/2008 | Ishido | H01L 23/49816 |
| | | | | 174/255 |
| 2009/0284935 | A1 * | 11/2009 | Chen et al. | 361/748 |
| 2010/0139965 | A1 * | 6/2010 | Wang et al. | 174/261 |
| 2010/0140798 | A1 * | 6/2010 | Topacio et al. | 257/737 |
| 2012/0188735 | A1 * | 7/2012 | Hiroshima et al. | 361/767 |
| 2012/0199389 | A1 * | 8/2012 | Furutani et al. | 174/264 |
| 2012/0252168 | A1 * | 10/2012 | Nah | H01L 21/563 |
| | | | | 438/124 |
| 2013/0025782 | A1 * | 1/2013 | Higo et al. | 156/306.6 |
| 2014/0054073 | A1 * | 2/2014 | Lee | H05K 1/0296 |
| | | | | 174/256 |

FOREIGN PATENT DOCUMENTS

| | | |
|---|---|---|
| JP | 2005-072099 A | 3/2005 |
| KR | 10-2008-0061816 A | 7/2008 |
| KR | 10-2008-0111701 A | 12/2008 |

* cited by examiner

*Primary Examiner* — Sherman Ng
(74) *Attorney, Agent, or Firm* — NSIP Law

(57) ABSTRACT

Disclosed herein are a printed circuit board (PCB) and a method of manufacturing the same. The PCB includes a core layer, metal bumps embedded in the core layer, one surface of the metal bumps being opened to the outside, and a solder resist layer including an opening is manufactured by a separating substrate manufacture method. In the PCB, empty space between the bumps is filled with an insulating material instead of solder resist, and thus, a problem in terms of an empty space between bumps is addressed without requiring a new solder resist process.

1 Claim, 5 Drawing Sheets

PRINTED CIRCUIT BOARD AND METHOD OF MANUFACTURING THE SAME

CROSS REFERENCE(S) TO RELATED APPLICATIONS

This application claims the benefit under 35 U.S.C. Section 119 of Korean Patent Application Serial No. 10-2012-0153495, entitled "Printed Circuit Board and Method of Manufacturing the Same" filed on Dec. 26, 2012, which is hereby incorporated by reference in its entirety into this application.

BACKGROUND OF THE INVENTION

1. Technical Field

The present invention relates to a printed circuit board (PCB) and a method of manufacturing the same.

2. Description of the Related Art

As a package-on-package that is a type of high density semiconductor package is being gradually used and intensity of a circuit is increased, a peripheral bump type substrate, that is, a substrate that does not require rearrangement at integrated circuit (IC) is being gradually increased. In addition, conventionally, during packaging, when an under-fill material such as non-conductive paste (NCP) is filled between bumps formed on a peripheral region, an empty space is frequently formed.

To address this problem, technologies such as a technology disclosed in Korean Patent Laid-open Publication No. 2008-0061816 reflect demands for developing technologies for filling solder resist (SR) ink. However, there is a limit in corresponding to the demands by a conventional SR process and technologies for sufficient mass production are not ensured. It is expected that this problem becomes more serious as a distance between bumps is reduced.

The above-described description of the related art background is owned to obtain he present invention by the inventor of the present invention or learned with induction of the present invention, and is not necessarily known to the general public prior to the filing of the present application.

RELATED ART DOCUMENT

Patent Document (Patent Document 1) Japanese Patent Laid-open Publication No. 2005-072099

SUMMARY OF THE INVENTION

An object of the present invention is to provide a printed circuit board (PCB) with a simple process and including bumps having high contact reliability, compared with a conventional PCB, and a method of manufacturing the PCB.

Other technical objects proposed by the present invention would be easily understood with reference to the following detailed description.

According to an exemplary embodiment of the present invention, there is provided a PCB including a core layer, metal bumps embedded in the core layer, one surface of the metal bumps being opened, and a solder resist layer formed on the core layer and including an open pattern.

In this case, the solder resist layer may include a first solder resist layer formed on the core layer and including the open pattern, and a second solder resist layer formed in the open pattern formed in the first solder resist and including a step difference with the first solder resist layer.

The core layer may include a via hole formed through opposite surfaces thereof.

The PCB may further include a first circuit layer formed on one surface of the core layer, the metal bumps being embedded in the one surface of the core layer, and a second circuit layer formed on the other surface of the core layer and electrically connected to the first circuit layer through the via hole.

The second solder resist layer may be formed to be thinner than the first solder resist layer.

According to another exemplary embodiment of the present invention, there is provided a method of manufacturing a printed circuit board (PCB), the method including: preparing a substrate core, forming a first circuit layer including metal bumps on the substrate core, stacking a core layer on the first circuit layer, forming a hole in the core layer and forming a second circuit layer connected to the first circuit layer, and coating solder resist on the second circuit layer.

The method may further include dividing the substrate core in opposite directions after the forming of the second circuit layer, wherein the substrate core is a detachable core, and first circuit layers are formed on opposite surfaces of the substrate core.

The metal bumps may have one surface exposed to the outside, the one surface being exposed when the substrate core is divided.

The forming of the first circuit layer may include stacking a first dry film on the substrate core and developing the first dry film in a predetermined pattern, forming the first circuit layer to correspond to the pattern of the first dry film, and removing the first dry film.

The forming of the second circuit layer may include stacking a second dry film on the core layer and developing the second dry film in a predetermined pattern, forming the second circuit layer to correspond to the pattern of the second dry film, and removing the second dry film.

In this case, the coating of the solder resist may include forming a first solder resist layer including an open pattern formed therein, on the core layer, and forming a second solder resist layer including a step difference with the first solder resist layer, in the open pattern formed in the first solder resist.

Other aspects, features, and advantages of the present invention in addition to the above description would be clarified with reference to the following detailed description.

DESCRIPTION OF THE PREFERRED EMBODIMENTS

Figure 1:
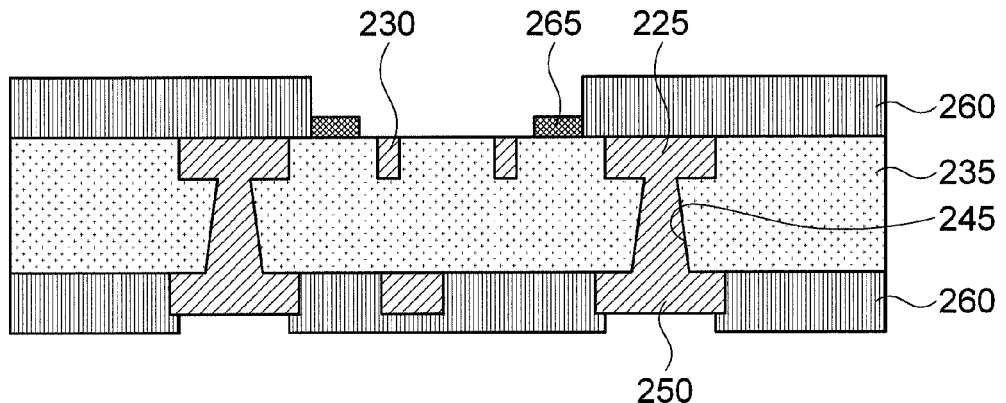
FIG. 1 is a cross-sectional view of a printed circuit board (PCB) in which metal bumps are embedded in a core layer, according to an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

The terms such as "first" and "second" are used herein merely to describe a variety of constituent elements, but the constituent elements are not limited by the terms. The terms are used only for the purpose of distinguishing one constituent element from another constituent element.

It will be understood that when a component is referred to as being "connected to" another component, it may be directly connected to the other component or a third component may intervene therebetween.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

The same reference numerals in the drawings denote the same elements, and thus, a detailed description thereof will be omitted. In the following description of the present invention, a detailed description of known functions and configurations incorporated herein will be omitted when it may make the subject matter of the present invention unclear.

FIG. 1 is a cross-sectional view of a printed circuit board (PCB) in which metal bumps 230 are embedded in a core layer 235, according to an embodiment of the present invention. Referring to FIG. 1, a first circuit layer 225, the metal bumps 230, the core layer 235, via holes 245, a second circuit layer 250, a first SR layer 260, and a second SR layer 265 are shown.

According to the present embodiment, bumps embedded in a substrate may be formed without any additional processes compared with a conventional method of manufacturing a substrate. That is, according to the present embodiment, metal bumps are formed in a core layer that is an insulating layer, thereby obtaining excellent bump width tolerance even in a post-process of circuit etching.

The first circuit layer 225 is a circuit layer formed on one surface of the core layer 235. The first circuit layer 225 may include the metal bumps 230. The metal bumps 230 may be embedded in the core layer 235 and may each have one surface that is exposed to the outside.

The via holes (or through holes) 245 may be formed in the core layer 235. The via holes 245 may be formed via a laser process or a drilling process using CNC. The via holes 245 may be filled with a conductive material or inner side surfaces of the via holes 245 may be coated with the conductive material in order to electrically connect circuit layers formed on opposite surfaces of the core layer 235. The first circuit layer 225 may be electrically connected to the second circuit layer 250 formed on the other surface of the core layer 235 through the via holes 245.

The core layer 235 may be generally formed of an insulating material, or alternatively, may be formed of a metal material such as aluminum (Al) in order to increase heat dissipation efficiency of a substrate. When the core layer 235 is formed of the metal material, an insulating layer may be further formed prior to formation of a circuit layer in order to prevent a short.

A semiconductor chip or a cavity may be formed in the core layer 235 such that various electronic components may be inserted into the core layer 235. For example, electronic components such as an active device, for example, an integrated circuit (IC), a semiconductor chip, and a center processing unit (CPU) as well as a passive device, for example, MLCC and LTCC may be inserted into the cavity formed in the core layer 235. In this case, the height of the electronic component may be the same as the height of the core layer 235.

The first SR layer 260 and the second SR layer 265 are formed on the core layer 235 and openings are formed in the first SR layer 260 and the second SR layer 265. The openings may be formed as opening patterns that are generated by spacing portions of a SR layer apart from each other and correspond to regions of the core layer 235, which are exposed to the outside.

In detail, the SR layer may be formed on the core layer 235 and may include the first SR layer 260 including the opening formed therein and the second SR layer 265 that is formed in the opening formed in the first SR layer 260 and forms a step difference with the first SR layer 260. The height of the second SR layer 265 formed in the opening of the first SR layer 260 may be smaller than the height of the first SR layer 260. However, the present invention does not preclude the case in which the height of the second SR layer 265 is greater than the height of the first SR layer 260.

In addition, the number of SR layers may be three or more. For example, a third SR layer (not shown) may be formed in another opening formed in the second SR layer 265.

As described above, conventionally, a bump width is reduced to 3 to 8 um and problems in terms of the durability occurs due to the reduced bump width after circuit etching because of pretreatment on the SR layer. However, according to the present embodiment, since the metal bumps 230 are embedded in the core layer 235, the bump width tolerance is relatively excellent.

In addition, in order to address the problem in terms of empty spaces between the metal bumps 230, technologies for coating a SR layer between the metal bumps 230 have been developed. However, although it is expected that such a structure addresses the problem in terms of the empty spaces, there is a need for a new SR etching technology in terms of manufacture of a PCB. In a conventional SR technology, a constant thickness is maintained via print and stack processes. However, in order to implement additional SR layers, there is a need for a new development technology and new facility investment.

According to the present embodiment, empty spaces may not be formed between the metal bumps 230 by embedding the metal bumps 230 in the core layer 235 without a new SR development technology and facility.

A method of manufacturing a PCB will now be described with regard to an embodiment of the present invention with reference to FIG. 2. Hereinafter, the following operations may be performed by devices for manufacturing the PCB. The operations may not be performed in time-series. The operations of which an order is changed may belong to the scope of the present invention as long as the feature of the present invention may be obtained.

Figure 2A:
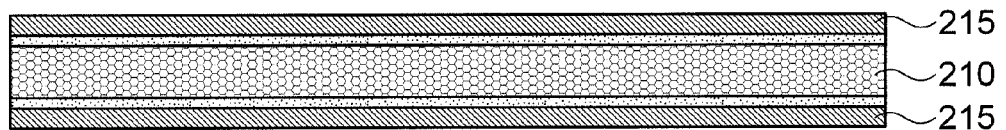
FIGS. 2A through 2J are cross-sectional views showing an order of a method of manufacturing a PCB, according to an embodiment of the present invention.

Referring to FIG. 2A, a substrate core 210 for manufacturing a substrate is prepared. An external layer 215 such as a metal layer may be formed on the substrate core 210 which may be a detachable substrate core. In this case, the following processes may be performed on opposite surfaces of the substrate core 210. After the processes are performed, the substrate core 210 may be divided to prepare a pair of substrates.

Figure 2B:
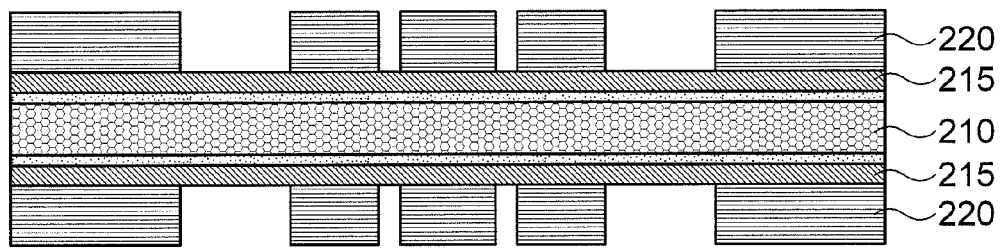

Referring to FIG. 2B, a first dry film 220 is stacked on the substrate core 210 and is developed in a predetermined pattern. The pattern formed by the first dry film 220 may correspond to a pattern formed on the first circuit layer 225.

Figure 2C:
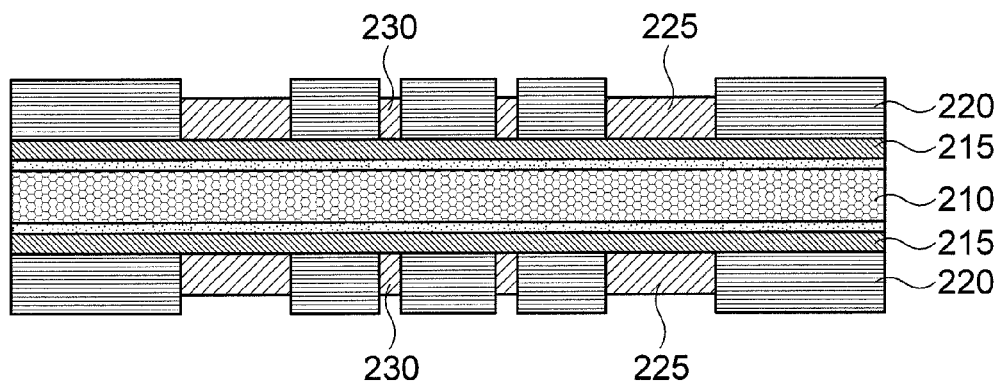

Referring to FIG. 2C, the first circuit layer 225 including the metal bumps 230 may be formed to correspond to the pattern of the first dry film 220. The first circuit layer 225 may be formed of a material with high conductivity, for example, copper (Cu). The first circuit layer 225 may be formed of a portion of the first dry film 220, through which the substrate core 210 is exposed by stacking the first dry film 220 on the substrate core 210. The metal bumps 230 may be embedded in the core layer 235 in a subsequent process. As described above, when the substrate core 210 is divided into an upper surface and a lower surface, the metal bumps 230 may be embedded in the core layer 235 such that one surface of each of the metal bumps 230 may be opened.

Figure 2D:
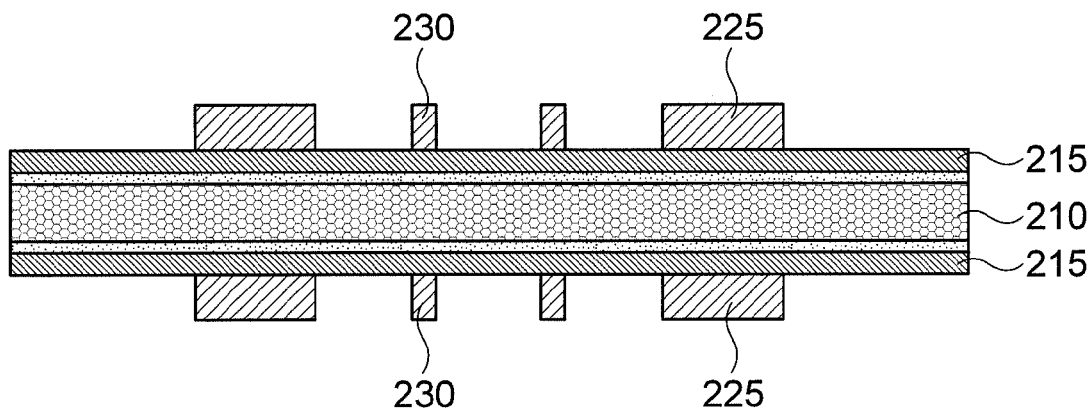
Figure 2E:
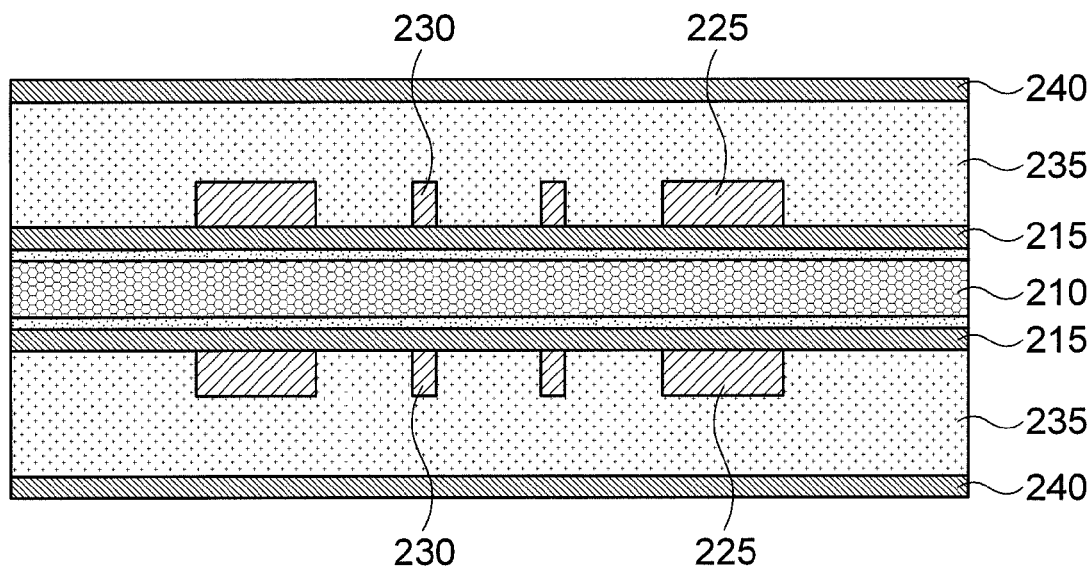

Referring to FIG. 2D, the first dry film 220 is removed. Then, referring to FIG. 2E, the core layer 235 is stacked. The core layer 235 may be formed of an insulating material, for example, prepreg (PPG). A core external layer 240 such as a metal layer may be formed as an external layer of the core layer 235.

Figure 2F:
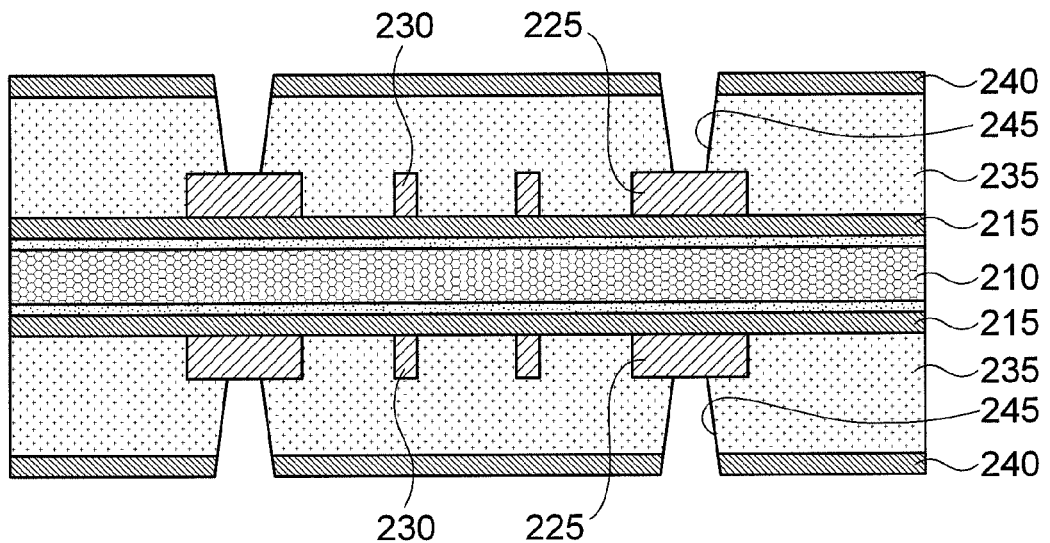

Referring to FIG. 2F, the via holes 245 are formed in the core layer 235 to expose the first circuit layer 225 therethrough. The via holes 245 may be formed by a laser process or a drilling process. The via holes 245 may be formed by processing portions of the core layer 235, which correspond to the first circuit layer 225.

The via holes 245 may each be formed to an appropriate width such that the second circuit layer 250 which will be described below may be electrically connected to the first circuit layer 225 and the shapes of the via holes 245 may be maintained. The via holes 245 may be filled with a conductive metal or only surfaces of the via holes 245 may be coated with a conductive metal.

Figure 2G:
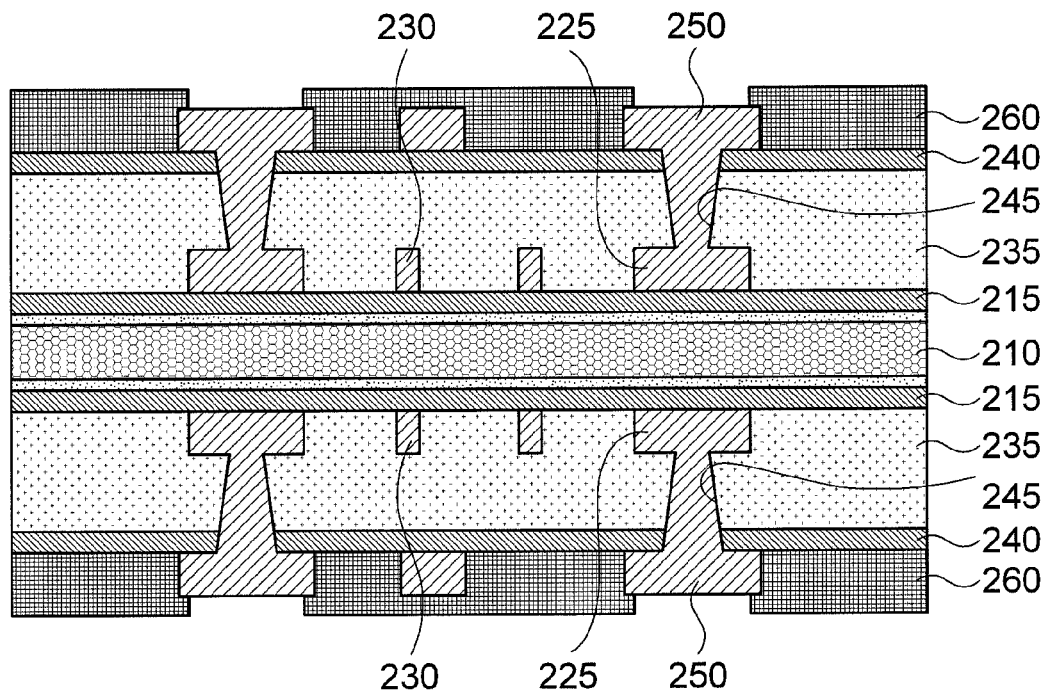

Referring to FIG. 2G, a metal layer is formed on the via holes 245 of the core layer 235 and the second circuit layer 250 connected to the first circuit layer 225 is formed. In detail, the second dry film 255 is stacked on the core layer 235 and is developed with a predetermined pattern and the second circuit layer 250 is formed to correspond to the pattern of a second dry film 255. Then, the second dry film 255 is removed. The pattern of the second circuit layer 250 may be different from the pattern of the first circuit layer 225. A pattern of each circuit layer may be predetermined according to an operation and function of a substrate.

Figure 2H:
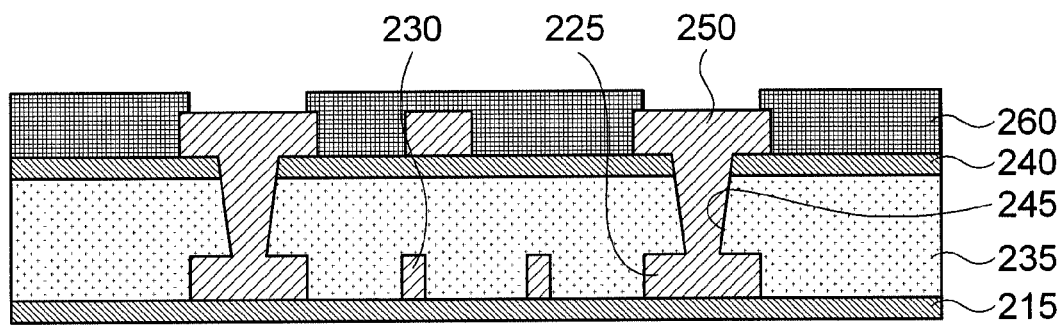
Figure 2H:
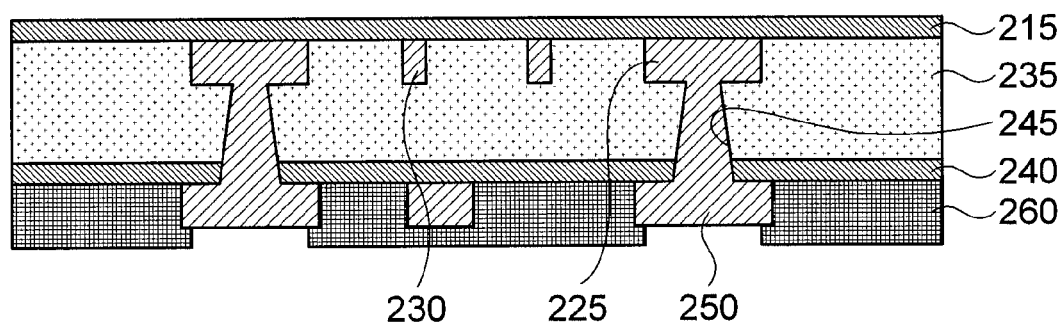
Figure 2I:
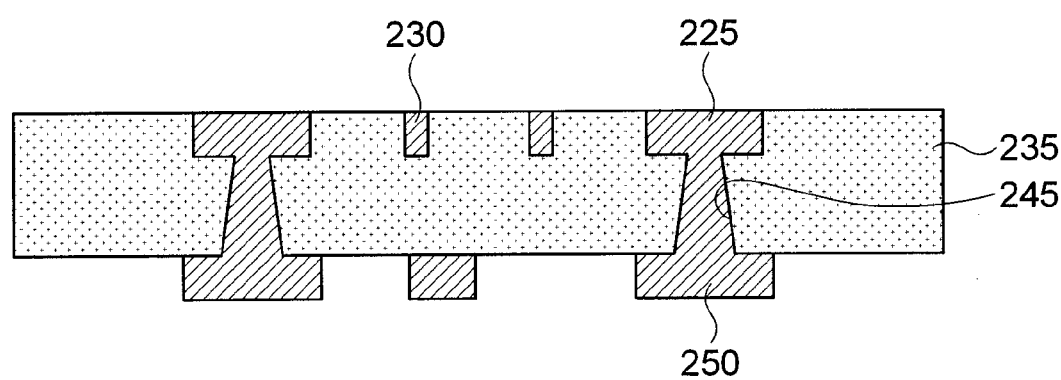

Referring to FIG. 2H, the substrate core 210 is divided in opposite directions. Referring to FIG. 2I, the second dry film 255 is removed and a metal layer as the external layer 215 is etched so as to expose the core layer 235 to the outside. In this case, the order in which the substrate core 210 is divided in the opposite directions and then the second dry film 255 is removed has been described. However, the present invention is not limited thereto. That is, second dry films 255 formed on opposite surfaces of the core layer 235 are removed and then the substrate core 210 may be divided in opposite directions.

Figure 2J:
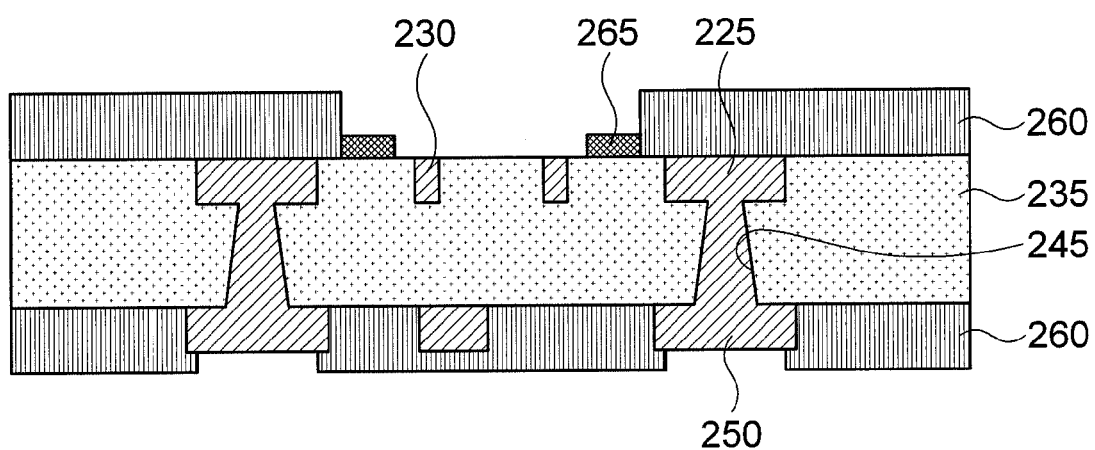

Referring to FIG. 2J, SR is coated on the first circuit layer 225 and the second circuit layer 250 in a predetermined pattern. In detail, the first SR layer 260 including the opening formed therein is formed on the core layer 235 and the second SR layer 265 including the step difference formed with the first SR layer 260 is formed in the opening formed in the first SR layer 260. The openings refer to portions of at least one of a core layer 235, the first circuit layer 225, and the second circuit layer 250, which are exposed to the outside.

The second SR layer 265 may be formed to be thinner than the first SR layer 260. In this case, the case in which the first SR layer 260 is formed prior to formation of the second SR layer 265 and the second SR layer 265 is formed to be thinner than the first SR layer 260 has been described. However, the present embodiment is not limited thereto. That is, the second SR layer 265 may be formed prior to formation of the first SR layer 260 and the first SR layer 260 may be formed to be thinner than the second SR layer 265.

Materials, dimensions, manufacture environments/conditions, and the like of a PCB and a method of manufacturing the same according to embodiments of the present invention are obvious to one of ordinary skill in the art, and thus, a detailed description thereof is omitted here.

In a PCB and a method of manufacturing the same according to the present invention, metal bumps embedded in a core layer as an insulating layer in a substrate may be formed without any additional processes compared with a conventional method of manufacturing a substrate, thereby obtaining an excellent bump width tolerance even in a post-process of circuit etching.

In addition, in the PCB and the method of manufacturing the same according to the present invention, an empty space between bumps is filled with an insulating material instead of SR using a conventional substrate manufacturing method, and thus, a problem in terms of empty spaces between the bumps may be addressed without a new SR process.

Although the preferred embodiments of the present invention have been disclosed for illustrative purposes, those skilled in the art will appreciate that various modifications, additions, and substitutions are possible, without departing from the scope and spirit of the invention as disclosed in the accompanying claims. Accordingly, such modifications, additions, and substitutions should also be understood to fall within the scope of the present invention.

What is claimed is:

1. A printed circuit board (PCB), comprising:
a core layer;
metal bumps formed in one surface of the core layer such that only one surface of each of the metal bumps is exposed to the outside;
upper solder resist layers formed on the one surface of the core layer and each including an opening for exposing the metal bumps therethrough, wherein a step difference formed by the upper solder resist layers is formed on the one surface of the core layer, where the metal bumps are arranged;
a first solder resist layer formed in the one surface of the core layer;
a second solder resist layer formed on another surface of the core layer;
a via filled with a conductive material so as to electrically connect the first circuit layer and the second circuit layer; and
a lower solder resist layer formed on the other surface of the core layer and including an opening for exposing the second circuit layer therethrough, wherein a vertical central axis of the via is arranged to be within the opening of the lower solder resist layer.

* * * * *